United States Patent [19]
Keyser et al.

[11] Patent Number: 6,072,278
[45] Date of Patent: Jun. 6, 2000

[54] HIGH CAPACITANCE PIXEL FOR ELECTRONIC DISPLAYS

[75] Inventors: Thomas Keyser, Ellicott City; Gerald D. Becker, Eldersburg, both of Md.

[73] Assignee: AlliedSignal Inc., Morristown, N.J.

[21] Appl. No.: 09/119,512

[22] Filed: Jul. 20, 1998

Related U.S. Application Data

[60] Provisional application No. 60/054,854, Aug. 6, 1997.

[51] Int. Cl.$^7$ ........................................ H01J 9/00
[52] U.S. Cl. .................... 315/169.1; 315/169.3; 313/509
[58] Field of Search ............... 315/169.3, 169.1, 315/160; 313/505, 506, 509

[56] References Cited

U.S. PATENT DOCUMENTS

| | | | |
|---|---|---|---|
| 4,602,192 | 7/1986 | Nomura et al. | 315/169.3 |
| 5,463,279 | 10/1995 | Khormaei | 315/169.3 |

FOREIGN PATENT DOCUMENTS

| | | |
|---|---|---|
| 0717 445 A2 | 6/1996 | European Pat. Off. . |
| 0717 446 A2 | 6/1996 | European Pat. Off. . |

OTHER PUBLICATIONS

CRC Handbook of Chemistry and Physics, David R. Lide, Ph.D., 1998–1999 79$^{th}$ Edition, pp. 12–55, 12–46, 12–56.
Section Ch, Week 9428 Derwent Publications, Ltd., London, GB; Class G08, AN 94–227433 XP002085092 & JP 06 09546 A (Toshiba KK), Apr. 8, 1994 See abstract.

*Primary Examiner*—David Vu
*Attorney, Agent, or Firm*—Loria B. Yeadon

[57] ABSTRACT

An electroluminescent device in accordance with the present invention includes a first conductive layer having a portion thereof for connecting to a gate of a blocking transistor formed on a substrate. A dielectric layer is formed on the first conductive layer, the dielectric layer having a dielectric constant of at least six. A second conductive layer is formed on the dielectric layer such that the first and second conductive layers have portions which form electrodes of a hold capacitor and the dielectric layer provides a capacitor dielectric between the electrodes such that the dielectric layer continuously covers the device. A pixel electrode is associated with and coupled to the blocking transistor. An electroluminescent stack and a transparent electrode are included wherein the electroluminescent stack is disposed between the transparent electrode and the pixel electrode such that when the blocking transistor is activated the pixel electrode associated therewith illuminates and is maintained in an illuminated state by the hold capacitor.

14 Claims, 8 Drawing Sheets

HIGH CAPACITANCE PIXEL FOR ELECTRONIC DISPLAYS

RELATED APPLICATION DATA

This application claims priority to Provisional Application Serial No. 60/054,854 filed Aug. 6, 1997, which is incorporated herein by reference.

GOVERNMENTAL INTEREST

The U.S. Government through The Advanced Research Projects Agency, Agreement No. MDA972-95-3-0029, has a paid-up license in this invention to practice or have practiced on behalf of the United States the subject invention throughout the world.

BACKGROUND OF THE INVENTION

1. Field of the Invention

The present invention relates to electroluminescent structures and, more particularly, to an active matrix electroluminescent display having a plurality of high-performance pixels.

2. Description of the Related Art

Electroluminescent (EL) displays produce light when an alternating current (AC) voltage is applied across a phosphor film sandwiched between a pair of electrodes. If an organic material is used, a similar structure is employed however excitation of the organic material is performed in a different manner, for example using DC current. Referring to FIG. 1, electroluminescent light originates from metal activator atoms that are introduced into a phosphor film 12 and excited by energetic electrons as they move across the semi-conducting phosphor film 12. Since the phosphors employed have large band gaps, visible radiation produced (indicated by arrows) passes through film 12 without absorption and out of the stack through a transparent electrode 14.

The typical EL film stack contains two dielectric layers 16 and 18, one at each electrode interface, i.e. one for transparent electrode 14 and one for electrodes 20. These dielectric layers limit the current through the structure and prevent a catastrophic breakdown should a phosphor imperfection produce a conductive path through film 12. Dielectric layers 16 and 18 also store charge, increase the internal electric field and reduce the effective turn-on voltage of the phosphor. High dielectric constant films are often used to enhance the effect and increase the luminous efficiency of EL displays.

Compact high-resolution displays have been produced with on-chip scanning and pixel control circuitry. In these "active matrix" displays, the necessary dielectric, phosphor and transparent electrode layers are deposited and defined as a single rectangle over the entire pixel array. Referring again to FIG. 1, individual pixel electrodes 20 are controlled by switching a transistor 22 which blocks the AC phosphor excitation voltage 24 when "off" and allows passage current through the phosphor when "on". Pixel electrodes 20 are positioned directly over the controlling transistors, to maximize resolution.

Referring to FIG. 2, one example of a control circuit is schematically shown. The control circuit includes a low voltage access transistor 32 connected to a data line 34. The state of a pixel 40 is programmed by asserting a select line 36 to turn on access transistor 32. The voltage on data line 34 is then stored onto a hold capacitor 38. A logic signal turns on a blocking transistor 30 to thereby allow conduction current to illuminate the pixel. Likewise blocking transistor 30 may be turned off by a different logic signal to maintain the pixel in an "off" state. Pixel 40 includes two electrodes and an EL stack as described with reference to FIG. 1.

Referring again to FIG. 1, in a typical AMEL display, a plurality of pixel electrodes 20 are formed as "islands" in a layer insulated from a silicon-on-oxide (SOI) structure in which the active semiconductor circuits are formed. These semiconductor circuits are connected to the pixel electrodes through respective contact holes formed in the insulating layer. Electroluminescent (EL) stack 12 is formed over the pixel electrodes 20, and this EL stack is a "sandwich" of EL material, typically phosphor, between top 16 and bottom 18 insulated layers.

A transparent conductive layer forms a transparent electrode 14, which receives the high voltage source 24, is provided on top of the EL stack; and this entire thinfilm structure is on a base or substrate 28 formed of silicon, glass, quartz or other suitable material.

Referring again to FIG. 2, in operation, low voltage access transistor 32 controls high-voltage (blocking) transistor 30, and the high-voltage transistor 30 turns on and "addresses" its associated pixel to illuminate the adjacent (or proximate) electroluminescent material in response to a signal received via a common pixel electrode (transparent electrode 14 of FIG. 1), the signal being in the order of 100 to 400 volts (AC or DC).

Such an overall arrangement is disclosed in a U.S. Pat. No. 5,485,055 ('055) to T. Keyser and assigned to the assignee of the present invention; moreover, in the '055 patent, the array of pixel electrodes has a uniformly textured surface for an enhanced brightness of the display. The '055 patent is incorporated herein by reference.

AMEL display technology is also disclosed in the following publications:

R. Khormaei, et al., "11.3: High-Resolution Active-Matrix Electroluminescent Display," SID 94 DIGEST 137; R. Khormaei, et al., "42.3: A 1280×1024 Active-Matrix EL Display," SID 95 DIGEST 891; and L. Arbuthnot, et al., "24.3: A 2000-lpi Active-Matrix EL Display 374, " SID 96 DIGEST, which are all incorporated herein by reference.

In the prior art, active matrix electroluminescent displays depend on an internal pixel capacitor or hold capacitor 38 to maintain the high voltage blocking transistor 30 in the desired state between write cycles. For the grounded DMOS structure the source of blocking transistor 30 and an electrode of hold capacitor 38 are grounded. The conventional method for creating the pixel or hold capacitor 38 is to deposit a thin (2000 Å) layer of oxide between a first metal layer and a second metal of the structure wherein each metal layer act as an electrode of hold capacitor 38. Although this method is reasonably effective for larger pixels, for example, 24 $\mu$m pixels, as pixel size is reduced, the area available to develop the necessary capacitance to maintain the blocking transistor in the specified state becomes increasingly small. As a result, affected pixels tend to "turn on" when written "off" and thereby degrade image quality.

Therefore, a need exists for an active matrix electroluminescent display having a plurality of high-performance pixels wherein improved capacitance is achieved thereby permitting reduced pixel size.

SUMMARY OF THE INVENTION

The present invention will be described in terms applicable to an AMEL for illustrative purposes only and is not intended to limit the applicability of the invention. The present invention finds utility in an active matrix display wherein a silicon nitride film, or other high dielectric constant material, is integrated within the layers of the semiconductor construction. The nitride layer employed here provides an at least two-fold capacitance increase for the pixel, enabling a reduced size pixel, for example, 12 microns. Additionally, when used as a continuous film, it affords a more conformal coating, giving improved metal-to-metal isolation, and provides an effective diffusion barrier against contamination by species inadvertently incorporated during subsequent processing, assembly and operation.

Another approach separates the two levels of metal to create regions of thinner and/or higher dielectric constant material over the lower capacitor plate (bottom electrode) and deposit thicker and/or lower dielectric constant material in the surrounding areas.

This can be accomplished by depositing a relatively thick dielectric layer, applying a photoresist mask to protect the film outside the edges of the capacitor electrodes and etching back the dielectric layer over the capacitor electrodes to the desired thickness. Composite dielectric layers, including a relatively thin (2000 Å) and/or high dielectric constant base layer and a relatively thick (4000 to 8000 Å) and/or low dielectric constant top layer, can be employed with an etch, which etches the top layer selectively over the base layer, to optimize the capacitance and uniformity of the capacitor.

Alternatively, the capacitor can be formed by removing all of the dielectric exposed over the capacitor plates through the openings in the mask and then depositing the desired, thick and/or high dielectric constant film over the entire surface or by growing a thin and/or high dielectric constant film on the surface of the exposed capacitor electrodes.

An electroluminescent device in accordance with the present invention includes a first conductive layer having a portion thereof for connecting to a gate of a blocking transistor formed on a substrate. A dielectric layer is formed on the first conductive layer, the dielectric layer having a dielectric constant of at least six. A second conductive layer is formed on the dielectric layer such that the first and second conductive layers have portions which form electrodes of a hold capacitor and the dielectric layer provides a capacitor dielectric between the electrodes such that the dielectric layer continuously covers the device. A pixel electrode is associated with and coupled to the blocking transistor. An electroluminescent stack and a transparent electrode are included wherein the electroluminescent stack is disposed between the transparent electrode and the pixel electrode such that when the blocking transistor is activated the pixel electrode associated therewith illuminates and is maintained in an illuminated state by the hold capacitor.

In alternate embodiments of the electroluminescent device, the dielectric layer may include an oxidized portion of the first conductive layer. The dielectric layer is preferably between about 500 Å and about 2000 Å, but may be less than about 3000 Å. The dielectric layer may include silicon nitride, oxidized silicon nitride, aluminum oxide, titanium oxide or tantalum oxide. A head mount display comprising the electroluminescent device may also be included.

Another electroluminescent device in accordance with the present invention includes a first conductive layer having a portion thereof for connecting to a gate of a blocking transistor formed on a substrate. A composite dielectric layer is formed on the first conductive layer. The dielectric layer includes at least two sublayers wherein at least one sublayer includes a high dielectric constant of at least six. One of the sublayers may be formed by removing a portion of the thickness of a deposited layer to form a region of thinned dielectric material between electrodes. This layer is preferably a lower dielectric constant layer. A second conductive layer is formed on the composite dielectric layer such that the first and second conductive layers have portions which form electrodes of a hold capacitor and the composite dielectric layer provides a capacitor dielectric between the electrodes such that the high dielectric constant sublayer continuously covers the device. A pixel electrode is associated with and coupled to the blocking transistor. An electroluminescent stack and a transparent electrode are included wherein the electroluminescent stack is disposed between the transparent electrode and the pixel electrode such that when the blocking transistor is activated the pixel electrode associated therewith illuminates and is maintained in an illuminated state by the hold capacitor.

In alternate embodiments of the electroluminescent device having a composite dielectric layer, the composite dielectric layer may include a thinned dielectric sublayer between the electrodes. The high dielectric sublayer is preferably between about 500 Å and about 2000 Å, and the composite layer is preferably less than about 3000 Å. The composite dielectric layer may include silicon nitride, oxidized silicon nitride, aluminum oxide, titanium oxide or tantalum oxide. The electroluminescent device may further include a lower dielectric constant sublayer of the composite dielectric layer which includes a lower dielectric material than the high dielectric constant sublayer, said lower dielectric sublayer being disposed about and above lateral sides of the pixel electrode. A head mount display comprising the electroluminescent device may also be included.

In still another electroluminescent device, the device includes a first conductive layer having a portion thereof for connecting to a gate of a blocking transistor formed on a substrate. A dielectric layer is formed on the first conductive layer, the dielectric layer including regions of reduced thickness. A second conductive layer is formed on the composite dielectric layer such that the first and second conductive layers have portions which form electrodes of a hold capacitor and the regions of reduced thickness provide a capacitor dielectric between the electrodes such that the dielectric layer provides greater capacitance per unit area for the hold capacitor. A pixel electrode is associated with and coupled to the blocking transistor. An electroluminescent stack and a transparent electrode are included wherein the electroluminescent stack is disposed between the transparent electrode and the pixel electrode such that when the blocking transistor is activated the pixel electrode associated therewith illuminates and is maintained in an illuminated state by the hold capacitor. The regions of reduced thickness are preferably between about 500 Å and about 2000 Å in thickness.

These and other objects, features and advantages of the present invention will become apparent from the following detailed description of illustrative embodiments thereof, which is to be read in connection with the accompanying drawings.

BRIEF DESCRIPTION OF THE DRAWINGS

The invention will be described in detail in the following description of preferred embodiments with reference to the following figures wherein.

DETAILED DESCRIPTION OF PREFERRED EMBODIMENTS

This invention relates to active matrix electronic displays, for example, an active matrix electroluminescent (AMEL) display used for head-mounted display (HMD) systems because of their inherent light weight, compactness and rugged qualities as well as their low-power characteristics and more particularly, to an active matrix electroluminescent display having a plurality of high-performance pixels. Active matrix electroluminescent displays depend on an internal pixel capacitor or hold capacitor to maintain a high voltage blocking device in the desired state between write cycles. As pixel size is reduced, the area available to develop the necessary capacitance becomes diminishingly small. Affected pixels tend to "turn on" when written "off". The present invention includes the integration of a high dielectric constant film within the layers of the semiconductor structure. The high dielectric constant film or layer provides a capacitance increase for the pixel electrode and, since the material affords a more conformal coating, gives improved metal—metal yields. In addition, since nitrides are effective diffusion barriers, a nitride layer, for example, would reduce the risk of contamination by species inadvertently deposited during EL processing or transit.

Figure 3:
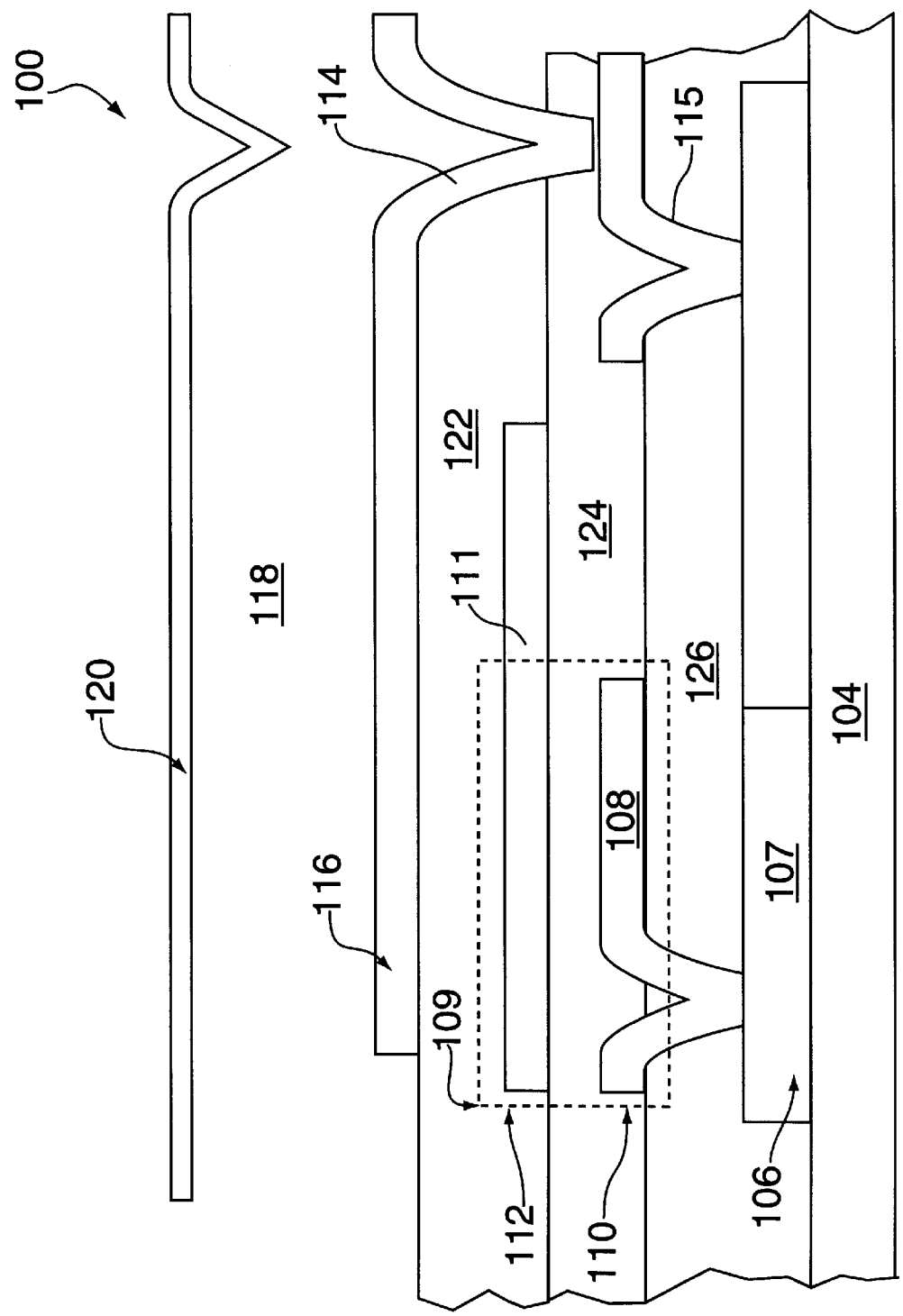
FIG. 3 is a cross-sectional view of an AMEL pixel device with a high dielectric constant layer functioning as a capacitor dielectric for a hold capacitor in accordance with the present invention.

Referring now in specific detail to the drawings where like numerals represent the same or similar elements and initially to FIG. 3, an electroluminescent (EL) structure is shown and referred to generally as structure 100. A substrate 102 is provided for fabricating an increased capacitance EL pixel electrode structure. Substrate 102 is preferably silicon although other suitable materials are contemplated. Devices 107 for control circuitry as described above are included on a device layer 106 and include blocking transistors 130 and access transistors 132 (shown in FIG. 4).

An insulating layer 104 is formed on substrate 102 to isolate devices formed thereon from substrate 102. Insulating layer is preferably formed from silicon dioxide or equivalent materials. Device layer 106 is formed on insulating layer 104. Device layer 106 is preferably silicon. Devices 107 include transistors or other semiconductor devices. Transistors and capacitors comprise the control circuitry for activating pixel electrode 116 as described above with reference to FIG. 2.

Figure 1:
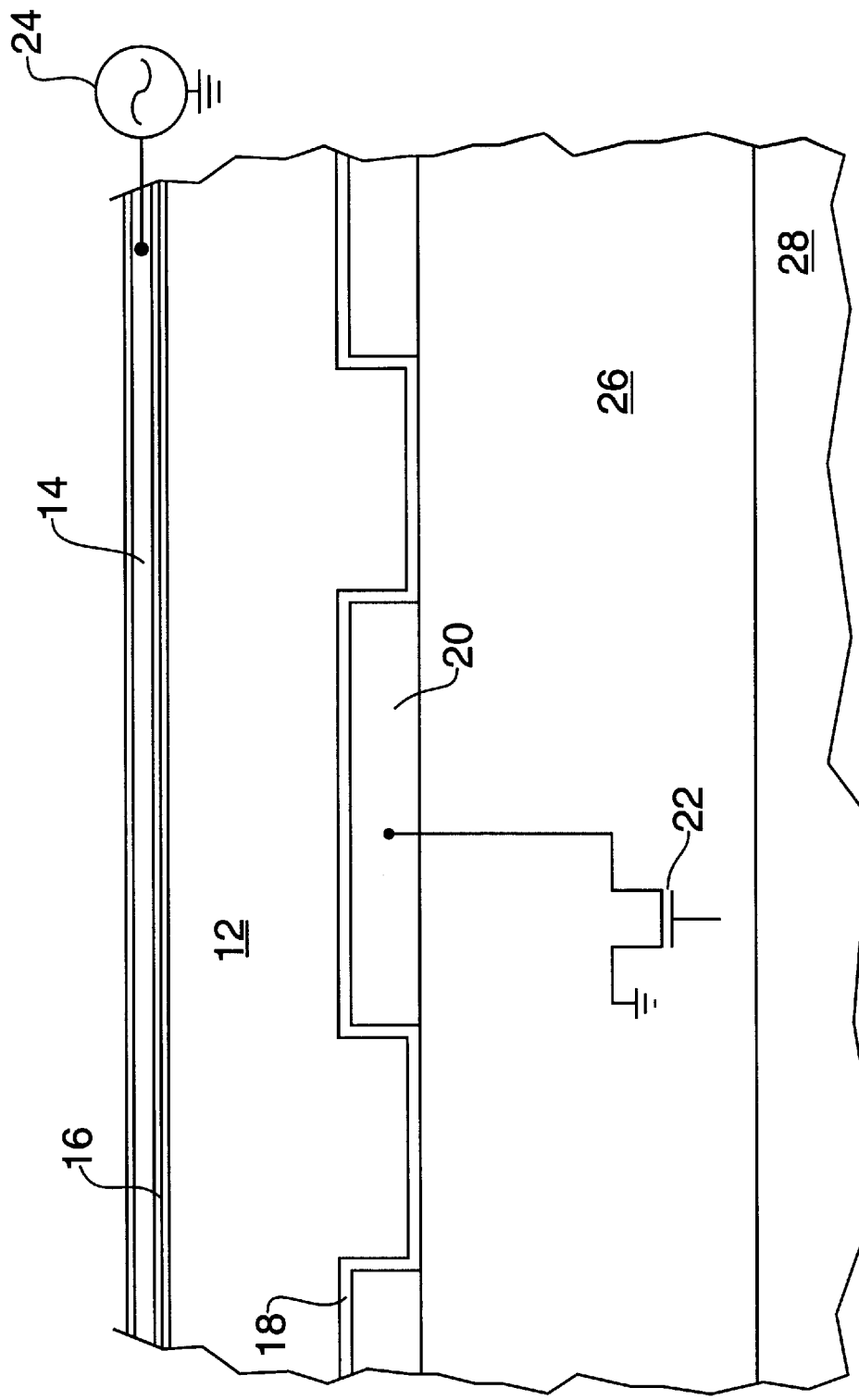
FIG. 1 is a cross-sectional view an active matrix electroluminescent (AMEL) pixel device in accordance with the prior art.
Figure 2:
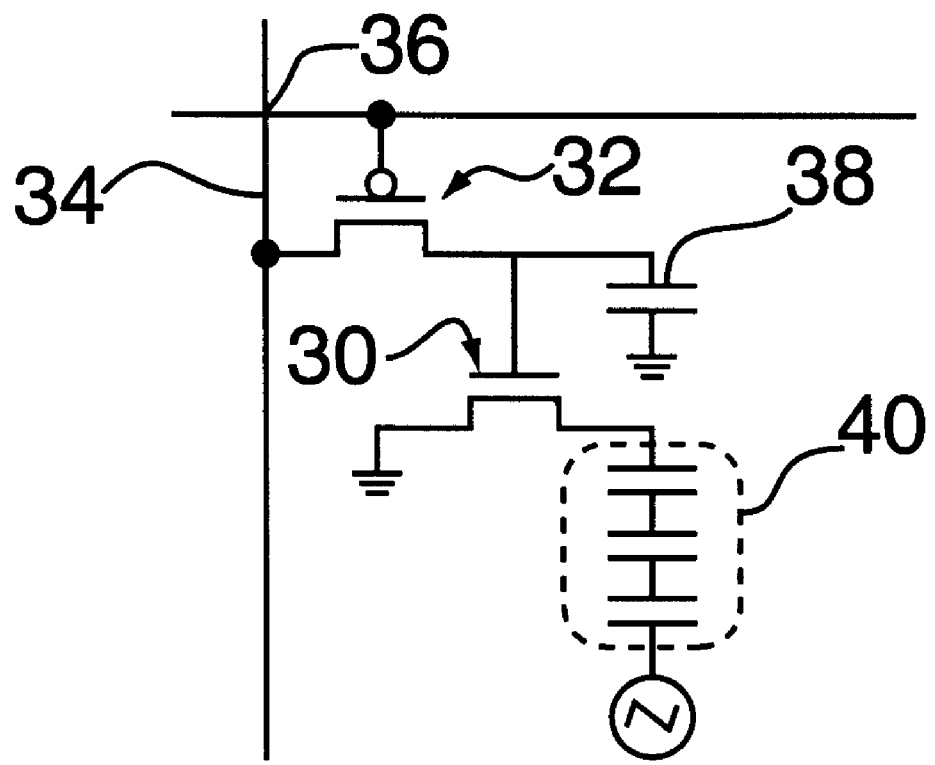
FIG. 2 is a schematic diagram of a pixel circuit in accordance with the prior art.

A dielectric layer 126 is formed on device layer 106. A conductive layer 110 is deposited on dielectric layer 126. Conductive layer 110 forms a first electrode 108 for a hold capacitor 109. Electrode 108 connects to a gate of a blocking transistor 130 (FIG. 4) used to activate pixel electrode 116. Electrode 108 also connects to one end of access transitor 32 (FIG. 2). A high dielectric constant layer 124 is deposited over an entire surface of structure 100 on conductive layer 110 and another conductive layer 112 is formed on dielectric layer 124. A portion of conductive layer 112 forms a second electrode 111 of hold capacitor 109. In one embodiment, conductive layer 112 can function as a capacitor plate and/or a high voltage shield to protect controlling transistors from phosphor (EL) excitation signals. Conductive layer 112 connects to control circuitry, for example, a transistor source, such as blocking transistor 130 (FIG. 4) source to tie it to ground.

An interlevel dielectric layer 122 is deposited to isolate the control circuitry from pixel electrode 116. Dielectric layer 122 is then planarized using established chemical-mechanical polishing (CMP) or by providing a sacrificial layer and etching it back to provide a planarized surface for the formation of additional layers as described hereinafter. Vias 114 and 1 15 connect a drain of blocking transistor 130 (FIG. 4) in device layer 106 to electrode 116.

An electroluminescent stack 118 and a transparent electrode 120 are formed continuously across a surface of the structure 100. Electroluminescent stack 118 may include a dielectric layer above and below it to isolate electroluminescent layer 118 from pixel electrode 116 and transparent electrode 120, respectively. Electroluminescent stack 118 preferably includes zinc sulfide, strontium sulfide or organic materials. For organic materials, electroluminescent stack 118 does not include dielectric layers above and below it, instead an electron transport layer and a hole transport layer sandwich an organic electroluminescent layer.

In accordance with the present invention, high dielectric constant layer 124 provides a capacitor dielectric between electrodes 111 and 108. Deposited high dielectric constant material may include materials having a dielectric constant greater than about 6. Preferred materials include silicon nitride, oxidized silicon nitride, aluminum oxide, titanium oxide or tantalum oxide, and their equivalents. By employing higher dielectric constant materials, the thickness may be maintained (which is preferably between about 2000 Å to about 3000 Å) thereby increasing the capacitance by at least two-fold, if a nitride layer is used, without compromising the insulator properties of the layer. This permits a reduction in pixel size to about 12 microns, for example. Further improvements in pixel size are contemplated. Advantageously, high dielectric constant layer 124 is deposited over the entire surface of structure 100, thereby acting as a diffusion barrier for later processing and increasing chip yield.

Figure 4:
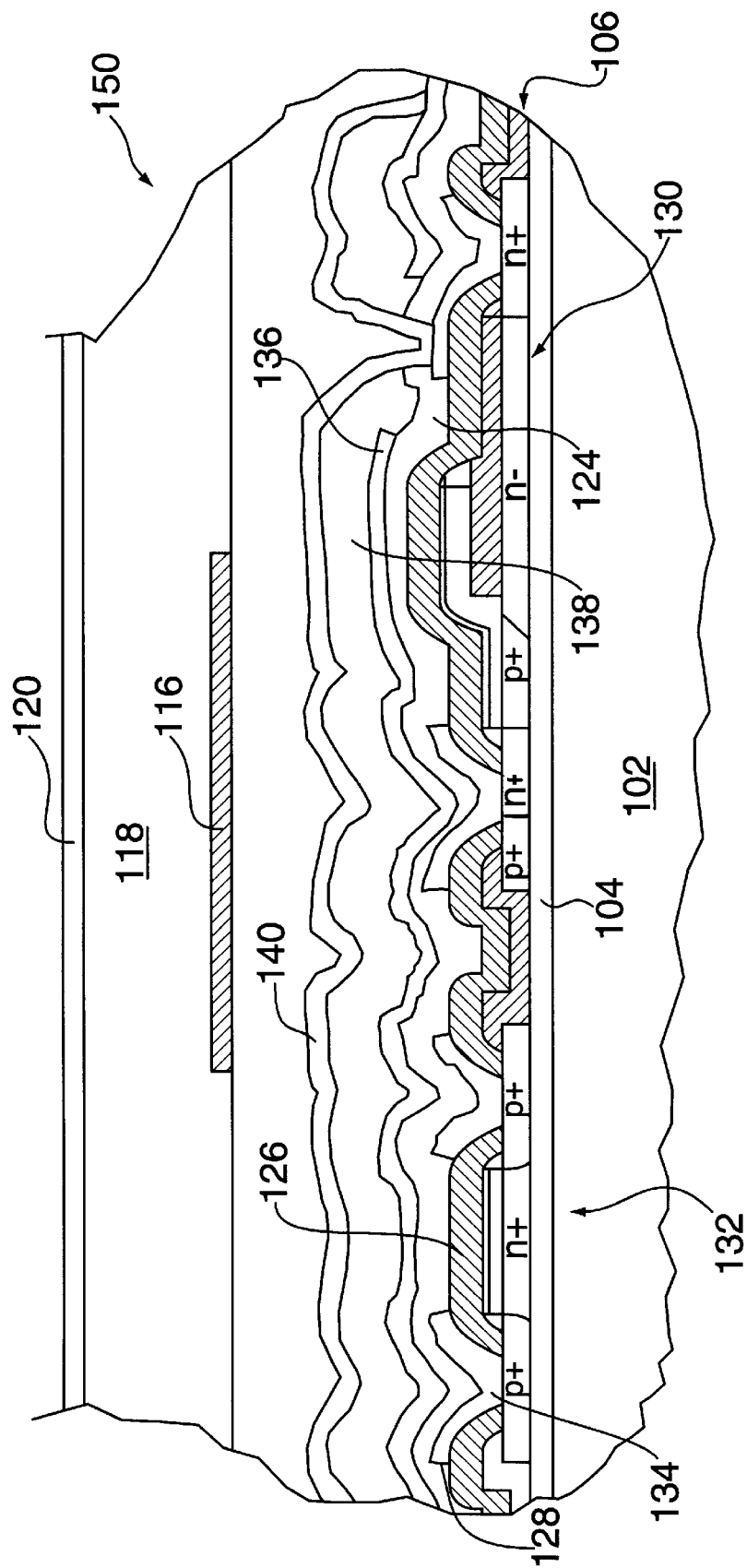
FIG. 4 is a cross-sectional view of an AMEL pixel device with a high dielectric constant layer in accordance with the present invention.

Referring to FIG. 4, a blocking transistor 130 "blocks" high voltage from pixel electrode 116 until an access transistor 132 activates blocking transistor 130 to turn "on" pixel electrode 116. Blocking transistor 130 is preferably a double-diffused metal oxide semiconductor (DMOS) device or high voltage NMOS (n-doped metal oxide semiconductor). Access transistor 132 is preferably a p-doped metal oxide semiconductor (PMOS) device. Transistors 132 and 130 include diffusion regions (indicated by n's and p's) which are sources and drains for these devices. Pixel electrode 116 is coupled to transistors (see FIG. 2) to be activated by the transistors as described hereinabove.

A first conductive layer 128 is deposited on interlevel dielectric layer 126. Conductive layer 128 includes contacts 134 for creating electrical connections to devices in layer 106, such as transistors 130 and 132. First conductive layer 128 includes a first plate for an internal pixel or hold capacitor as described and shown above. A high dielectric constant layer 124 is formed on first conductive layer 128. A second conductive layer 136 is formed on dielectric layer 124. Second conductive layer 136 functions as a second plate for the hold capacitor as well as a shield or interconnection layer for control circuitry. First and second conductive layers 128 and 136, respectively may include Tungsten, Titanium, Molybdenum, Aluminum, their alloys and equivalents.

High dielectric constant layer 124 is preferably from about 500 Å to about 2000 Å in thickness and extends over the entire surface of structure 150 as shown. It may be useful to maintain the thickness of layer 124 at about 2000 Å to about 3000 Å in thickness to further increase the isolation properties of the dielectric layer. When used as a continuous film, layer 124 affords a more conformal coating, giving improved metal-to-metal isolation between first and second conductive layers 128 and 136, respectively, and provides an effective diffusion barrier against contamination by species inadvertently incorporated during subsequent processing, assembly and operation.

Second conductive layer 136 has a dielectric layer 138 deposited thereon. Layer 138 may include silicon dioxide or other dielectric materials known in the art. For silicon dioxide, a thickness of between about 8000 Å to about 10,000 Å is preferred for layer 138. Additional metal layers 140 may be included as needed. Pixel electrode 116 connects to blocking transistor 130 which functions to turn pixel electrode 116 on and off.

Referring to FIGS. 5–9, in alternate embodiments, various dielectric layers may be implemented to provide improved dielectric characteristics between capacitor plates or electrodes. Stepped regions 202 are shown in FIGS. 5–9. Stepped portions 202 extend to a height H above a bottom electrode 204. Height H is preferably between about 4000 Å to about 8000 Å. A first conductive layer 205 is constructed and includes bottom electrode 204. A second conductive layer 207 is constructed over a capacitor dielectric material and forms a top electrode 206. First conductive layer 205 and second conductive layer may include other conductive structures, such as, a dataline 218.

Figure 5:
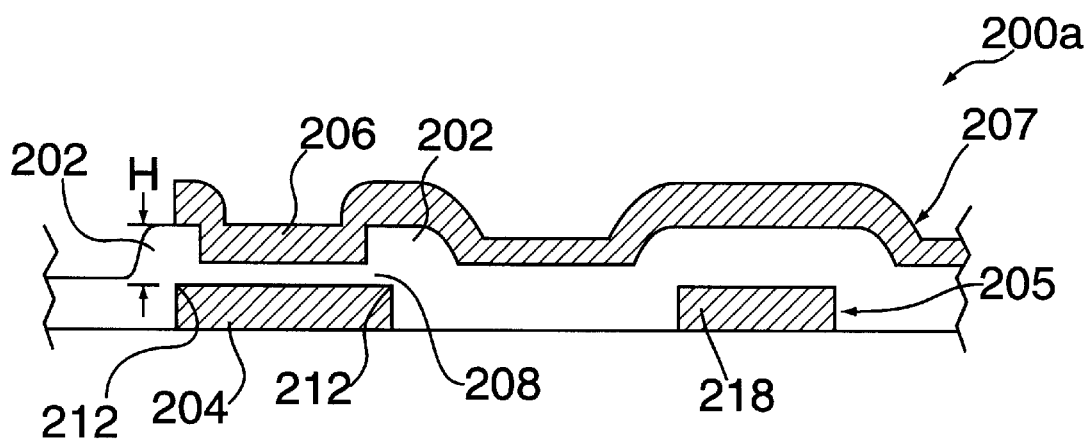
FIGS. 5–9 illustrate cross-sectional views of various embodiments of an AMEL pixel device with a high capacitance dielectric layer structure having improved dielectric characteristics in accordance with the present invention.

Referring to FIG. 5, a top electrode 206 is separated from bottom electrode 204 by a dielectric layer 208 which is deposited over bottom electrode (a first capacitor plate). Dielectric layer 208 is etched directly over bottom electrode 204 to thin out the dielectric material thereon to a predetermined thickness, for example between about 500 Å to about 2000 Å. By reducing the thickness of layer 208 directly over bottom electrode 204, characteristics of a capacitor 208 are improved, for example, greater capacitance per unit area is achieved. Further, since stepped regions 202 are present, a thicker material is present in surrounding areas to effectively isolate the first and second metal levels and provide improved yield. Also, since a predetermined area of layer 208 is removed over bottom electrode 204, the area of the capacitor can be defined more precisely. Layer 208 preferably includes silicon nitride or silicon oxide, however, other dielectric materials are contemplated.

Figure 6:
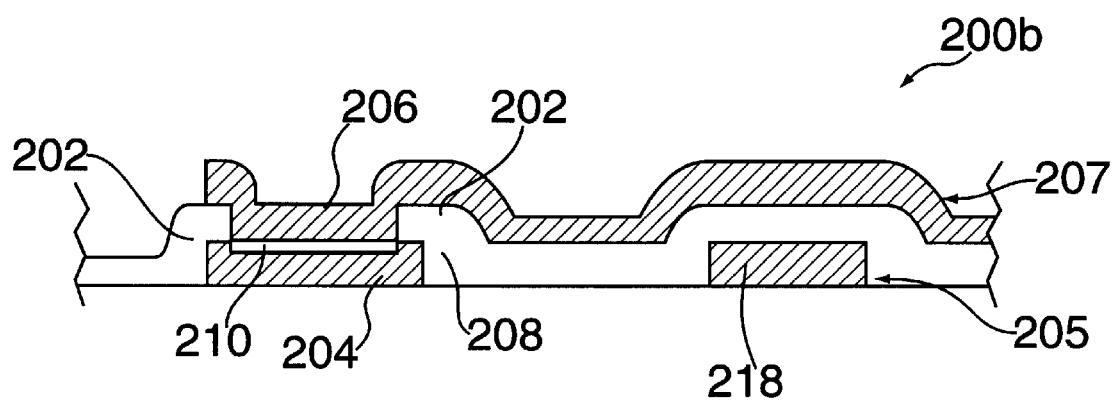

Referring to FIG. 6, a structure similar to that of FIG. 5 is shown. However, dielectric layer 208 is removed completely down to bottom electrode 204. The exposed bottom electrode 204 is then exposed in a reactive environment to form a dielectric barrier 210 on electrode 204. In preferred embodiments, first conductive layer 205 may include one of aluminum, polysilicon, tungsten, titanium, etc. and the reactive environment may include oxygen to form an oxide on electrode 204 to form barrier 210. Barrier 210 functions as the capacitor dielectric and has all the advantages as described with reference to FIG. 5.

Figure 7:
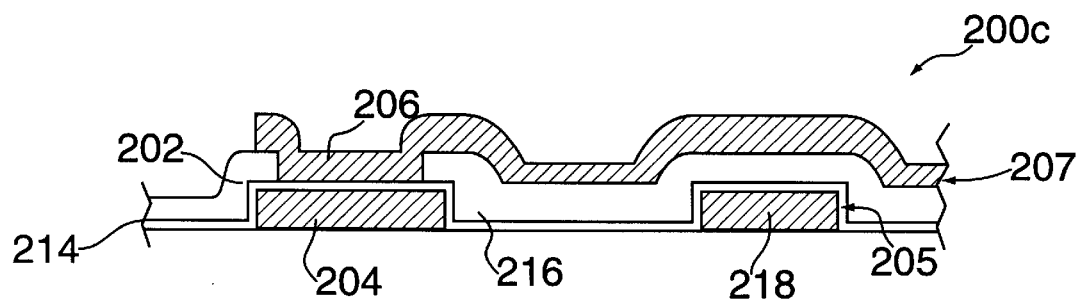
Figure 8:
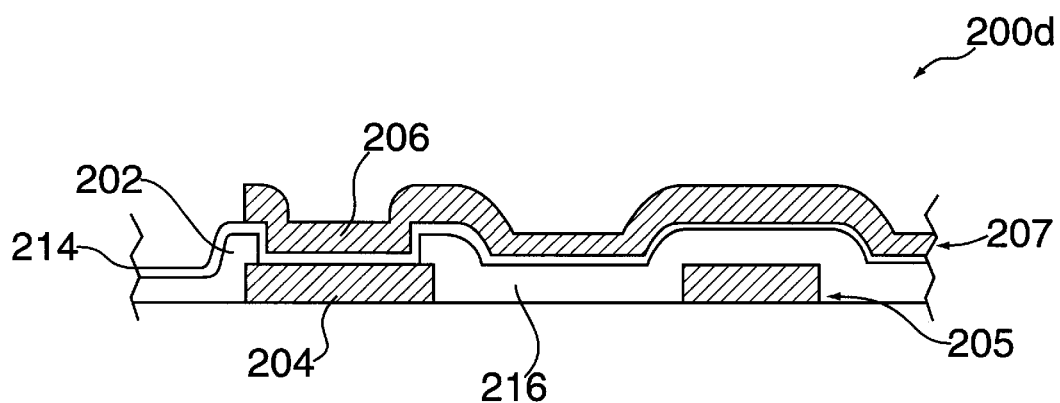

Referring to FIG. 7, a dielectric layer 214 is conformally deposited over first conductive layer 205. Dielectric layer 214 is preferably between about 500 Å to about 2000 Å. A dielectric layer 216 is formed over dielectric layer 214. Dielectric layer 216 is removed over bottom electrode 204 to permit deposition of top electrode 206 in an operative position relative to bottom electrode 204. Stepped regions 202 are formed. Dielectric layer 214 is preferably silicon nitride however other dielectric materials having a higher dielectric constant as described herein may be used. Dielectric layer 214 functions as the capacitor dielectric with all the benefits as described hereinabove. As shown in FIG. 8, a similar structure to that of FIG. 7 may be provided having dielectric layer 214 below dielectric layer 216.

Figure 9:
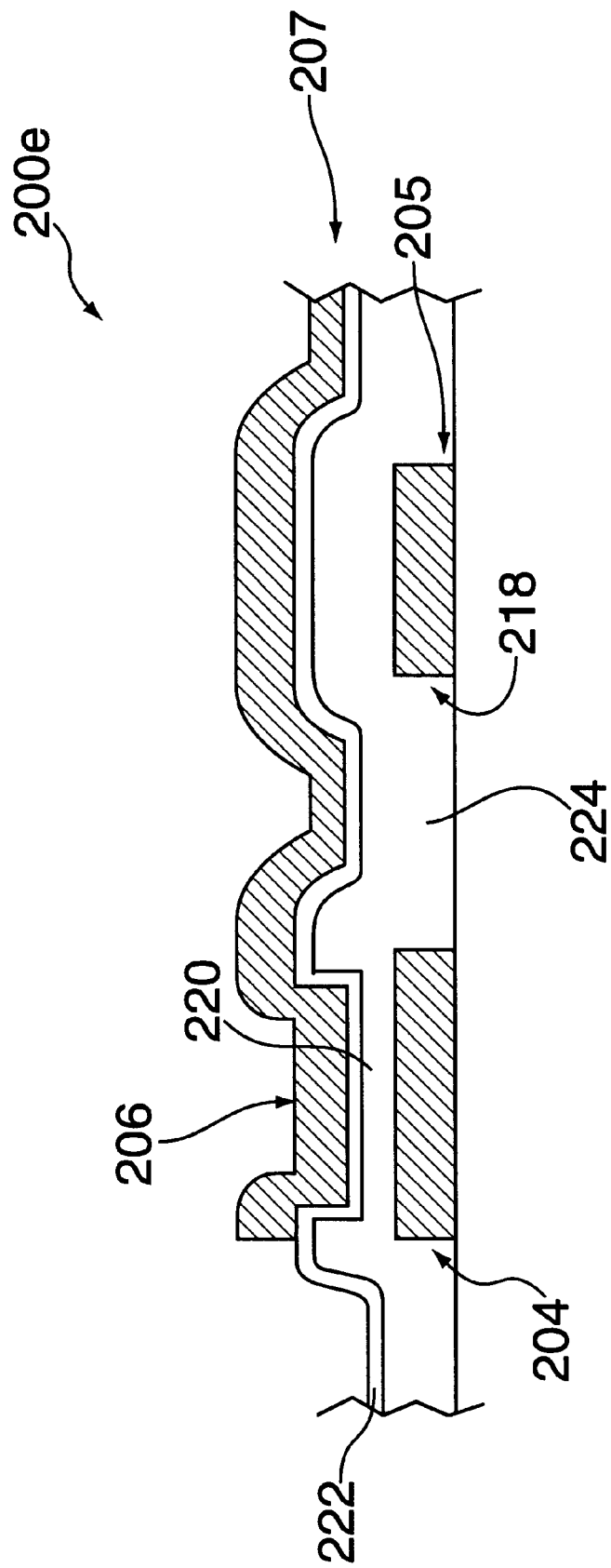

Alternately, as shown in FIG. 9, a composite dielectric layer 220 may be implemented by including a relatively thin high dielectric constant layer and a thinned out dielectric layer. Layer 220 may include a high dielectric material 222, for example silicon nitride, etc. and a thinned dielectric layer 224 having a lower dielectric constant material, for example silicon oxide. Layer thicknesses may be adjusted (as with all the embodiments described with reference to FIGS. 5–9) to achieve desired characteristics between electrodes 204 and 206. The capacitance and uniformity of the capacitor may be processed by either etching back layer 224 or growing layer 222 to optimize the capacitance and uniformity of the capacitor between electrodes 204 and 206.

Figure 10:
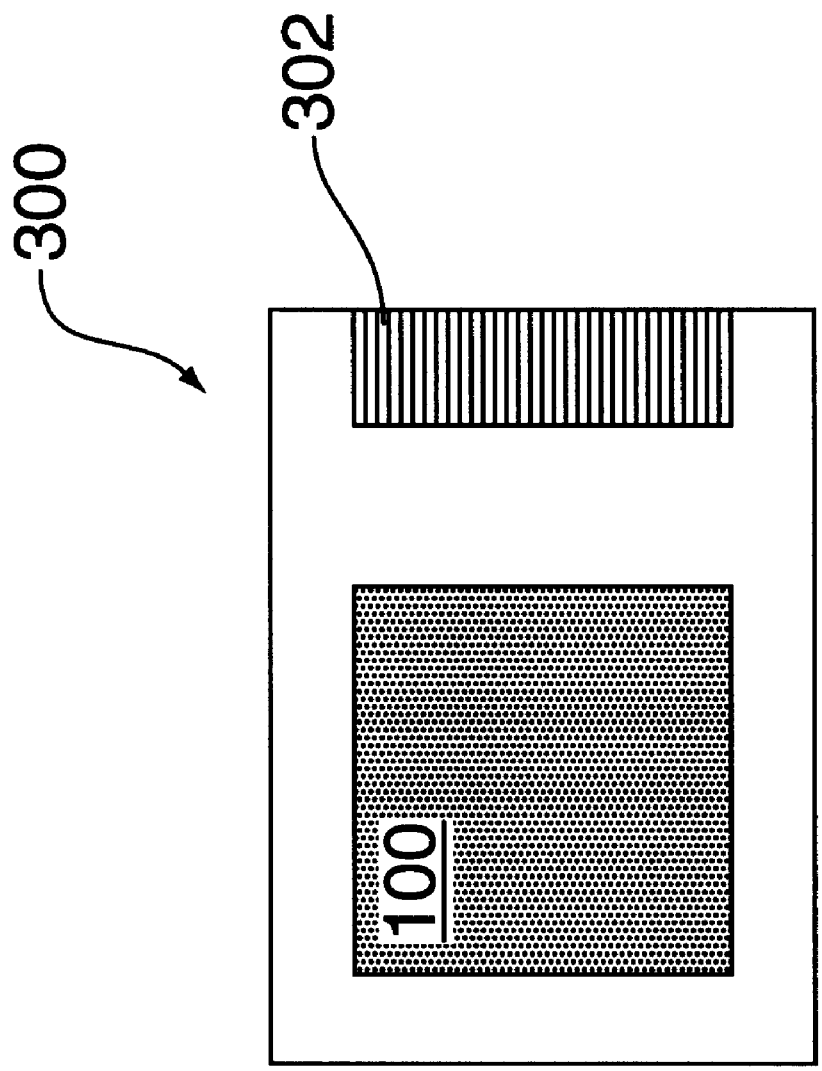
FIG. 10 is a top view of an electroluminescent display in accordance with the present invention.

Referring to FIG. 10, a display 300 is shown including structures 100 (150 or 200a–e) in accordance with the present invention. Display 300 includes a plurality of pixels each having a corresponding electrode as described above. Display 300 includes bonding pads for electrically connecting display 300 to a controller and a power source (both not shown) through connector interface 302. Bonding pads are normally located on the outer perimeter of structure 100 and connect to wires or metal lines which electrically couple structure 100 to interface 302. Display 300 receives data signals to be displayed from a controller, and is powered by a power source (not shown). Display 300 may be used as a wearable monitor in for example, a head mounted display.

Having described preferred embodiments of improved electroluminescent devices (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

What is claimed is:

1. An electroluminescent device comprising:

a substrate;

a blocking transistor formed on the substrate;

a first conductive layer having a portion thereof for connecting to a gate of said blocking transistor formed on said substrate;

a dielectric layer formed on the first conductive layer, the dielectric layer including regions of reduced thickness and at least one sublayer having a dielectric constant of at least six, said at least one sublayer, having a range covering portion of said dielectric layer to the entire dielectric layer;

a second conductive layer formed on the dielectric layer such that the first and second conductive layers have portions which form electrodes of a hold capacitor and the regions of reduced thickness provide a capacitor dielectric between the electrodes;

a pixel electrode associated with and coupled to the blocking transistor; and a transparent electrode wherein an electroluminescent stack is disposed between the transparent electrode and the pixel electrode such that when the blocking transistor is activated the pixel electrode associated therewith illuminates and is maintained in an illuminated state by the hold capacitor.

2. The electroluminescent device as recited in claim 1, wherein the dielectric layer is an oxidized portion of the first conductive layer.

3. The electroluminescent device as recited in claim 1, wherein the dielectric layer is between about 500 Å and about 2000 Å.

4. The electroluminescent device as recited in claim 1, wherein the dielectric layer includes a thickness of less than about 3000 Å.

5. The electroluminescent device as recited in claim 1, wherein the dielectric layer includes silicon nitride.

6. The electroluminescent device as recited in claim 1, wherein the dielectric layer includes aluminum oxide.

7. The electroluminescent device as recited in claim 1, wherein the dielectric layer includes titanium oxide.

8. The electroluminescent device as recited in claim 1, wherein the dielectric layer includes tantalum oxide.

9. A head mount display comprising the electroluminescent device as recited in claim 1.

10. The electroluminescent device as recited in claim 1, wherein said dielectric layer further comprises a second sublayer formed from a dielectric material having a dielectric constant less than the dielectric constant of said at least one sublayer wherein the second sublayer includes a thinned thickness between the electrodes.

11. The electroluminescent device as recited in claim 10, wherein the thinned thickness is eliminated in a predetermined area between the electrodes.

12. An electroluminescent device comprising:

a first conductive layer having a portion thereof for connecting to a gate of a blocking transistor formed on a substrate;

a composite dielectric layer formed on the first conductive layer, the dielectric layer including at least two sublayers wherein one sublayer includes a high dielectric constant of at least six;

a second conductive layer formed on the composite dielectric layer such that the first and second conductive layers have portions which form electrodes of a hold capacitor and the composite dielectric layer provides a capacitor dielectric between the electrodes such that the high dielectric constant sublayer continuously covers the device;

a pixel electrode associated with and coupled to the blocking transistor; and a transparent electrode wherein an electroluminescent stack is disposed between the transparent electrode and the pixel electrode such that when the blocking transistor is activated the pixel electrode associated therewith illuminates and is maintained in an illuminated state by the hold capacitor; and wherein a lower dielectric constant sublayer of the composite dielectric layer includes a lower dielectric material than the high dielectric constant sublayer, said lower dielectric sublayer being disposed about and above lateral sides of the pixel electrode.

13. An electroluminescent device comprising:

a substrate;

a blocking transistor formed on said substrate;

a first conductive layer having a portion thereof for connecting to a gate of said blocking transistor;

a composite dielectric layer formed on the first conductive layer, the dielectric layer including regions of reduced thickness;

a second conductive layer formed on the composite dielectric layer such that the first and second conductive layers have portions which form electrodes of a hold capacitor and the regions of reduced thickness provide a capacitor dielectric between the electrodes such that the dielectric layer provides greater capacitance per unit area for the hold electrode;

a pixel electrode associated with and coupled to the blocking transistor; and a transparent electrode wherein an electroluminescent stack is disposed between the transparent electrode and the pixel electrode such that when the blocking transistor is activated the pixel electrode associated therewith illuminates and is maintained in an illuminated state by the hold electrode.

14. The electroluminescent device as recited in claim 13, wherein the regions of reduced thickness are between about 500 Å and about 2000 Å in thickness.

* * * * *